United States Patent
Farber et al.

(10) Patent No.: US 7,087,518 B2
(45) Date of Patent: Aug. 8, 2006

(54) METHOD OF PASSIVATING AND/OR REMOVING CONTAMINANTS ON A LOW-K DIELECTRIC/COPPER SURFACE

(75) Inventors: David Gerald Farber, Wylie, TX (US); William Wesley Dostalik, Plano, TX (US); Robert Kraft, Plano, TX (US); Andrew J. McKerrow, Dallas, TX (US); Kenneth Joseph Newton, Mckinney, TX (US); Ting Tsui, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/438,566

(22) Filed: May 15, 2003

(65) Prior Publication Data

US 2003/0224585 A1 Dec. 4, 2003

Related U.S. Application Data

(62) Division of application No. 10/096,140, filed on Mar. 8, 2002, now abandoned.

(51) Int. Cl.
  *H01L 21/322* (2006.01)
(52) U.S. Cl. .............. 438/633; 438/622; 438/471
(58) Field of Classification Search ........... 438/692, 438/706, 725, 778, 780, 633, 622, 471
  See application file for complete search history.

(56) References Cited

U.S. PATENT DOCUMENTS

| | | | |
|---|---|---|---|
| 6,066,572 A * | 5/2000 | Lu et al. ............... | 438/774 |
| 6,137,126 A * | 10/2000 | Avanzino et al. ........ | 257/288 |
| 6,268,294 B1 * | 7/2001 | Jang et al. .............. | 438/706 |
| 6,287,972 B1 * | 9/2001 | Ziger et al. ............. | 438/693 |
| 6,342,448 B1 | 1/2002 | Lin et al. | |
| 6,365,527 B1 * | 4/2002 | Yang et al. ............. | 438/761 |
| 6,376,353 B1 | 4/2002 | Zhou et al. | |
| 6,429,121 B1 * | 8/2002 | Hopper et al. .......... | 438/636 |
| 6,534,397 B1 * | 3/2003 | Okada et al. ........... | 438/633 |
| 6,562,700 B1 * | 5/2003 | Gu et al. ................. | 438/477 |
| 6,600,207 B1 * | 7/2003 | Huang et al. ........... | 257/508 |
| 2002/0098685 A1 | 7/2002 | Sophie et al. | |
| 2003/0003765 A1 * | 1/2003 | Gibson et al. .......... | 438/760 |
| 2003/0224585 A1 * | 12/2003 | Farber et al. ........... | 438/471 |

OTHER PUBLICATIONS

Copper Interconnects Face FAB Realities, Volume Production Required Careful Attention to Facilities Design, Process Integration, Katherine Derbyshire, SemiConductor Magazine, Nov. 2001, vol. 2, No. 11, reprinted from the Internet at http://www.semi.org/web/wmagazine.nsf/ad09cecebf092171882565e6001fc57/d78d1863fd. 6 pages.
Wolf et al., Silicon Processing for the VLSI Era, vol. 1—Process Technology, 2nd ed., Lattice Press: Sunset Beach CA, 2000, pp. 743 and 746.

* cited by examiner

*Primary Examiner*—Laura M. Schillinger
(74) *Attorney, Agent, or Firm*—Jacqueline J. Garner; Wade James Brady, III; Frederick J. Telecky, Jr.

(57) ABSTRACT

One aspect of the invention relates to a method of removing contaminants from a low-k film. The method involves forming a sacrificial layer over the contaminated film. The contaminants combine with the sacrificial layer and are removed by etching away the sacrificial layer. An effective material for the sacrificial layer is, for example, a silicon carbide. The method can be used to prevent the occurrence of pattern defects in chemically amplified photoresists formed over low-k films.

7 Claims, 7 Drawing Sheets ically, an acid, which catalyzes a solubility-changing reaction that occurs during a post-bake operation following selective exposure of the photoresist to actinic radiation. Sometimes contaminants can occur which may impact negatively the pattern of the resist, which then may be transferred to an underlying material during subsequent patterning.
METHOD OF PASSIVATING AND/OR REMOVING CONTAMINANTS ON A LOW-K DIELECTRIC/COPPER SURFACE This is a divisional application of Ser. No. 10/096,140 filed Mar. 8, 2002 abandoned.

FIELD OF THE INVENTION

The present invention relates generally to semiconductor device manufacturing and more particularly to methods of forming metal interconnects.

BACKGROUND OF THE INVENTION

Integrated circuits include many discrete semiconductor devices. A multi-level network of metal within dielectric overlies and connects these discrete devices. For many years, the metal used was generally aluminum or an aluminum alloy. More recently, copper has been used in place of aluminum because copper's higher conductivity improves circuit performance.

Two major obstacles had to be overcome before copper could be used in integrated circuits. First, copper is difficult to etch in order to form wiring patterns. Second, copper diffuses rapidly. Copper can diffuse into silicon where it can cause junction failure. Copper can also diffuse through dielectric layers, degrading them and eventually traveling though them into device regions.

The problem of forming copper wiring patterns has been successfully overcome using damascene processes. In a damascene process, openings that form an image of an interconnection pattern are patterned in a dielectric layer. Copper is deposited or grown within these openings. Polishing is used to coplanarize the dielectric layer and the copper. This leaves a copper interconnection pattern inlaid within the dielectric layer. In a single damascene process, the dielectric is patterned through. Inter-level contacts are formed with one deposition and polishing step, and wiring with another deposition and polishing step. In a dual damascene process, the dielectric is patterned with both trenches and vias, whereby both inter-level contacts and wiring can be formed with a single metal deposition and polishing step. Regardless of which type of process is used, multiple layers are formed to create complex interconnection patterns.

The problem of copper diffusion into silicon and dielectric layers has been overcome using diffusion barriers. Layers of diffusion barrier material are provided between copper and adjacent dielectric or silicon. A variety of barrier materials have been reported. Conductive barrier materials include compounds of transition metals such as tantalum nitride, titanium nitride, and tungsten nitride as well as various transition metals themselves. Dielectric barrier materials include silicon nitride, silicon oxynitride, and PSG (a phophosilicate glass).

While the forgoing solutions have been implemented and copper has now been used for some time in integrated circuits, there is a continuing need to improve integrated circuit performance. For several years, efforts to improve integrated circuit performance have focused on replacing conventional dielectric materials, generally silicon dioxide, with low dielectric constant (low-k) materials. These materials provide a lower capacitance than silicon dioxide and consequently, increase circuit speed by decreasing the corresponding RC delay. Low-k barrier materials, such as SiC, are generally used with low-k dielectrics to achieve the goal of lowering overall capacitance.

Unfortunately, difficulties have arisen when patterning low-k dielectric layers. Low-k dielectric layers are patterned using lithography. Lithography refers to processes for pattern transfer between various media. In lithography for integrated circuit fabrication, the substrate or dielectric or other film to be patterned is coated uniformly with a radiation-sensitive film, the resist. The film is selectively exposed with radiation (such as visible light, ultraviolet light, x-rays, or an electron beam) through an intervening master template, the mask or reticle, forming a particular pattern. Exposed areas of the coating become either more or less soluble than the unexposed areas, depending on the type of coating, in a particular solvent developer. The more soluble areas are removed with the developer in a developing step. The less soluble areas remain on the substrate forming a patterned coating. The pattern of the coating corresponds to the image, or negative image, of the reticle. The patterned coating is used in further processing of the substrate, dielectric or other film.

One type of photoresist is a chemically amplified deep UV photoresist. A deep UV photoresist often is employed because resolution in lithography systems is primarily limited by diffraction of radiation passing through the reticle. Employing the small wavelengths of deep UV light reduces diffraction, however, it is difficult to produce deep UV light at high intensity. To compensate, a chemically amplified photoresist is used. In a chemically amplified photoresist, the radiation generates a catalyst, typically an acid, which catalyzes a solubility-changing reaction that occurs during a post-bake operation following selective exposure of the photoresist to actinic radiation. Sometimes contaminants can occur which may impact negatively the pattern of the resist, which then may be transferred to an underlying material during subsequent patterning.

Attempts have been made to remove contaminants from low-k dielectrics using conventional techniques, such as washing with solvents. Unfortunately, conventional techniques have not proven effective in preventing contamination of chemically amplified photoresist formed over low-k dielectrics. There remains an unsatisfied need for a method of dealing with contamination when low-k dielectrics are employed.

SUMMARY OF THE INVENTION

The following presents a simplified summary in order to provide a basic understanding of some aspects of the invention. This summary is not an extensive overview of the invention. It is intended neither to identify key or critical elements of the invention nor to delineate the scope of the invention. Rather, the primary purpose of the summary is to present some concepts of the invention in a simplified form as a prelude to the more detailed description that is presented later.

One aspect of the invention relates to a method of removing contaminants from a low-k film. The method involves forming a sacrificial layer over the contaminated film. The contaminants combine with the sacrificial layer and are removed by etching away the sacrificial layer. An effective material for the sacrificial layer is, for example, a silicon carbide. The method can be used to prevent the occurrence of pattern defects in chemically amplified photoresists formed over low-k films.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1A:
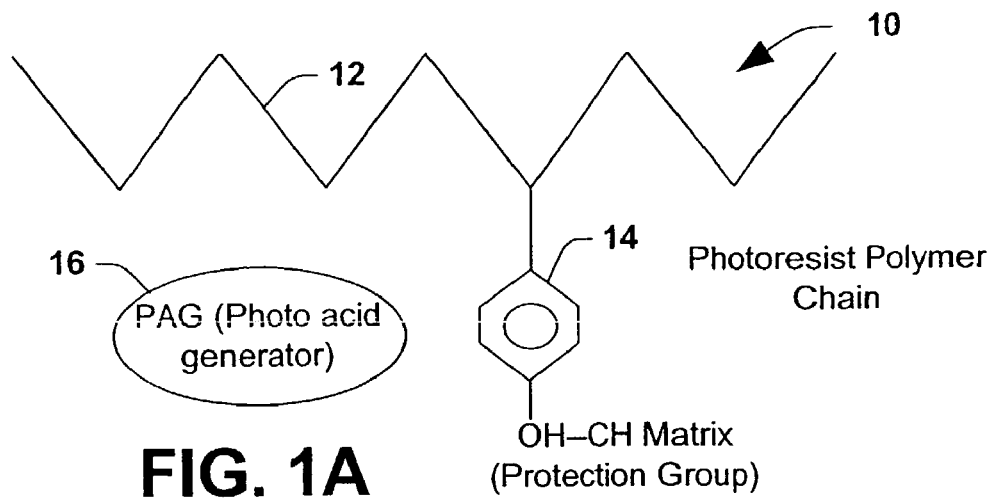
FIGS. 1A–1C are schematic illustrations of a resist undergoing exposure and development.

The present invention will now be described with reference to the attached drawings, wherein like reference numerals are used to refer to like elements throughout. The present invention relates to a method of eliminating or mitigating the negative effects of contaminants (e.g., associated with a dielectric layer) on a resist such as a DUV resist during semiconductor processing. According to one exemplary aspect of the invention, a sacrificial layer is formed over a dielectric film that may have one or more contaminants associated therewith. The potential contaminants are then removed by the removal of the sacrificial layer. Subsequently, one or more layers may then be formed over the dielectric and any subsequent patterned resist formed thereover then avoids pattern defects associated with the contaminants.

Historically, contaminants were not a significant problem with dense dielectric materials such as silicon dioxide, and with high quality diffusion barriers that were patterned with DUV resist or when the pattern was made with non-chemically amplified resists. However, it was noted by the inventors of the present invention that when using low-k dielectric materials, DUV resist in some cases would not take a pattern. That is, the desired pattern transfer from the photomask to the resist did not occur with sufficient accuracy (e.g., pattern defects). Although the exact cause of the problem is not known, it is believed that amino by-products from previous processing steps may be causing a source of contamination.

Figure 1B:
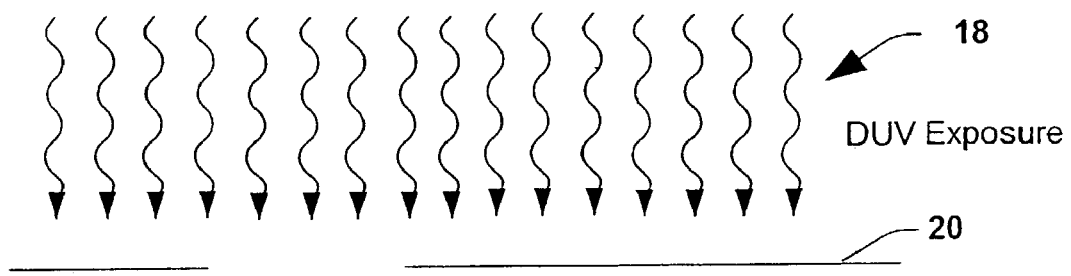
Figure 1B:
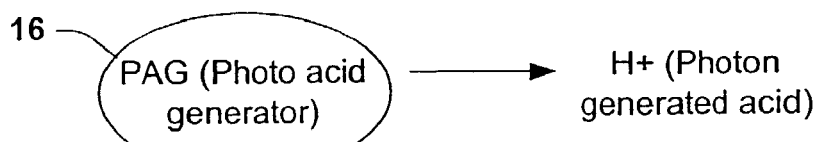
Figure 1C:
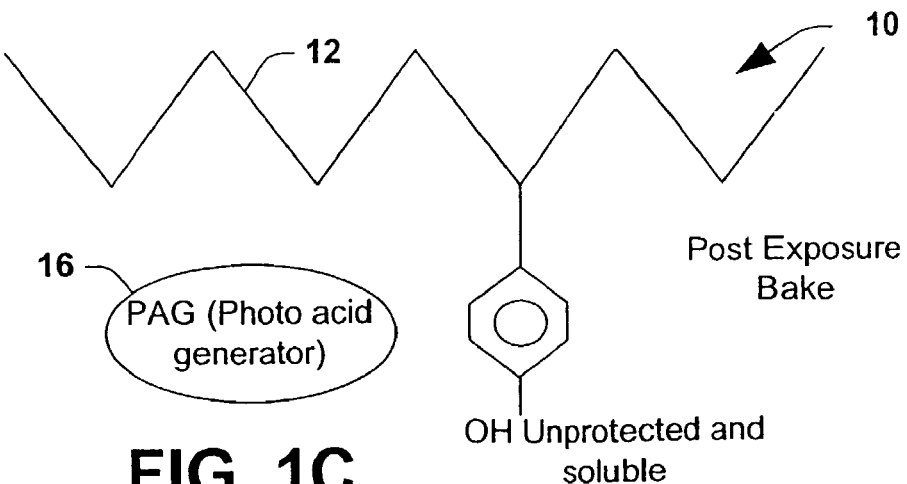

Referring generally to FIGS. 1A–1C, a light source is shown through a patterned opaque plate intended to illuminate predetermined regions in the resist that will be removed during subsequent development. When the photons impinge on regions of the resist, an acid is generated in local regions where the light is absorbed. After exposure to the DUV energy, the wafer is subjected to a post exposure bake (e.g., moved to a hot plate), where the acid induces subsequent chemical transformations including the changing of the solubility of the resist. Following the post exposure bake (PEB), a developer solution is placed on the wafer to remove the resist with the higher solubility.

Figure 2A:
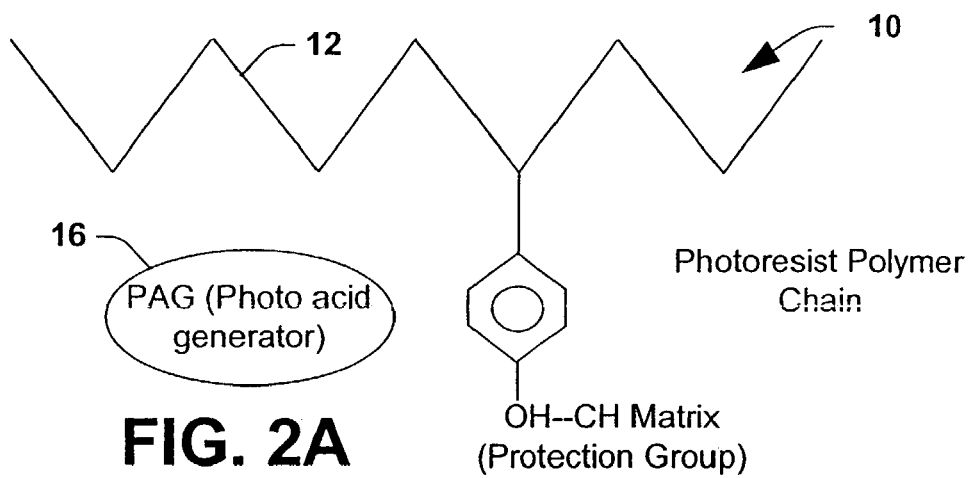
FIGS. 2A–2C are schematic illustrations of a resist undergoing exposure and development and experiencing a pattern defect due to contamination.
Figure 2B:
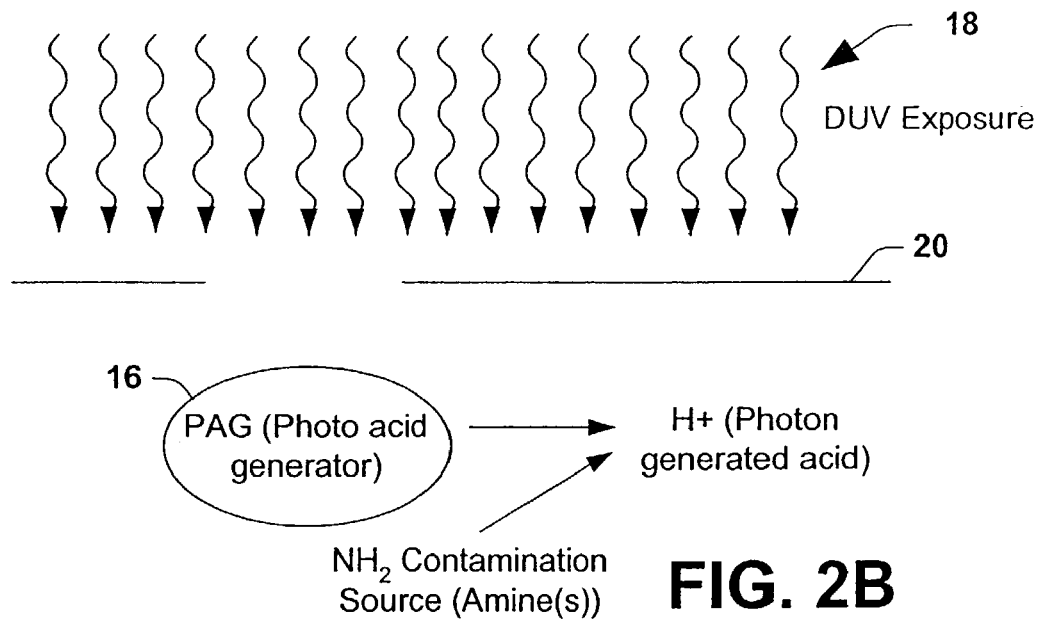
Figure 2C:
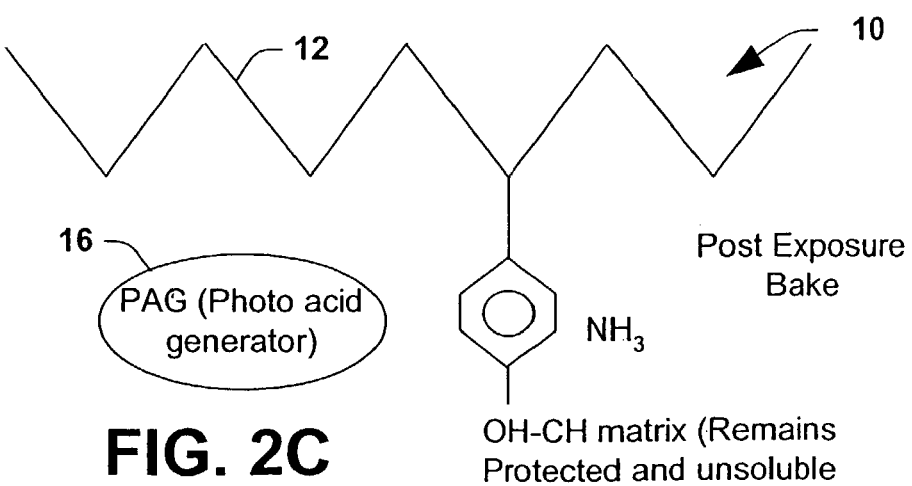

In particular, in FIG. 1A, a photoresist 10 is illustrated as a composition of polymer chains 12 with protection groups 14 and photon acid generators 16. Then in FIG. 1B, the transposing of a pattern into the resist is accomplished when acid is generated from DUV light 18 through a photomask 20. A reaction is then brought between the acid and the protection groups 14 with the PEB in FIG. 1C. This reaction converts an un-soluble matrix into one that is soluble in common base developers and thus leads to a pattern created by dissolution of the resist 10 in the light exposed regions (for a positive type resist, for example). In contrast, in FIGS. 2A–2C, an exemplary illustration is provided to show how it is believed that a base contaminate in the photoresist neutralizes the photon-generated acid before reactions can occur, which prevents proper resist patterning and resulting in a pattern defect.

The move to low-k materials as the inter-metal dielectric has required the use, in some instances, of low quality diffusion barriers in order to satisfy the overall capacitance (k-value) of the film stack. This has inadvertently affected how well contaminants are contained near their original location beneath the diffusion barrier film. In addition to the low quality diffusion barriers, the intrinsic porosity of low-k material compounds the above problem by acting as a reservoir for contaminants. The low-k material is expected to act as both a conduit and a storage center for contaminants generated in prior or future processing steps. Considering the potential for the low-k material to trap and act as a source of contaminants, coupled with the lower quality of some diffusion barriers, pattern defects discussed above are expected to form in overlying photoresists due to diffusion of such contaminants in underlying materials.

Figure 3A:
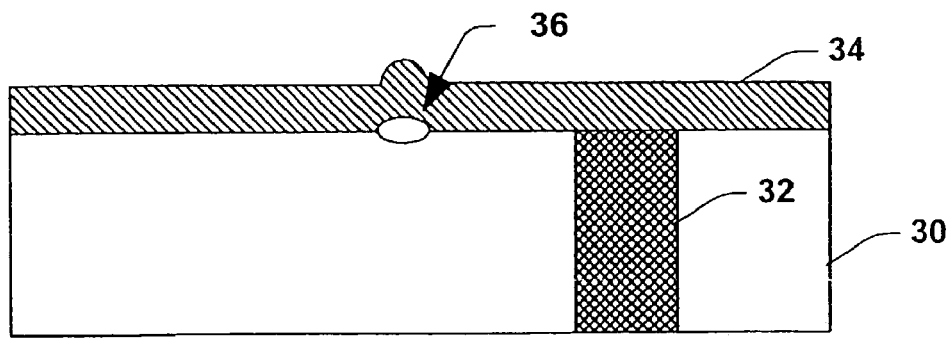
FIG. 3A is a cross section diagram illustrating a defect associated with a dielectric layer with a barrier layer lying thereover.

Turning to FIG. 3A, a typical integration using a low-k material with copper starts with a patterned low-k dielectric 30 that has been patterned, etched and filled with metal 32 such as copper, and then chemically mechanically polished (CMP) to form metal lines. During the CMP process, it is speculated by the inventors of the present invention that CMP slurry and/or residue is left on top of the low-k material and likely is absorbed into the surface thereof. After CMP cleaning, a passivation or barrier layer 34 is deposited over the copper 32 and low-k film 30. In some instances, the barrier deposition is followed by the deposition of another low-k dielectric (not shown) that will be subsequently patterned. If the photoresist used for such patterning fails to take the photon generated pattern due to the presence of a defect 36, the etch process will also fail local to the defect location and thus the desired shape will not be generated.

It is believed by the inventors of the present invention that something is either hindering the acid in the resist from being generated or neutralized once it has been generated. Since some CMP processes use a solution with a high pH (base solution) to clean the surface, it is possible that some of the base may be absorbed by the low-k dielectric 30 or trapped in remaining residue and later released. Once at the surface, the base may neutralize the acid and prevent the photoresist from taking the pattern. Another potential source identified by the inventors is the $NH_3$ pretreatment prior to the barrier deposition.

In appreciating the problem above and the various potential causes of such pattern defects within the resist, the inventors of the present invention hypothesized that by depositing a sacrificial layer (e.g., a reactive film) over the low-k dielectric material (e.g., the contamination source), a reaction may occur with the defect. Then, by removing the sacrificial layer (e.g., with an etch back process) the defect is also removed.

Figure 3B:
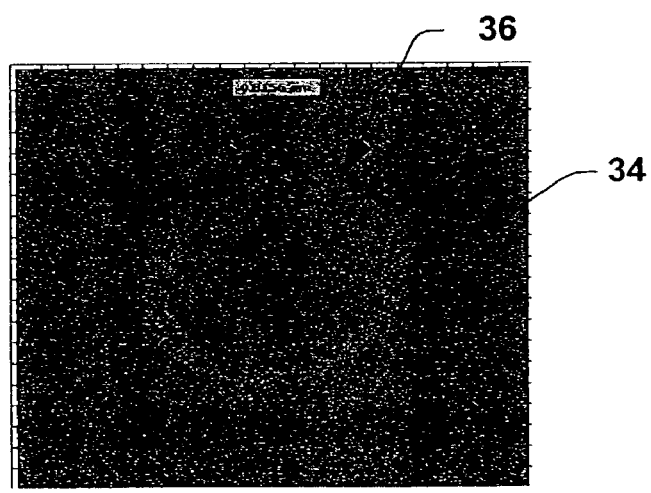
FIGS. 3B–3C are plan views of SEM photographs illustrating a contaminant underlying a barrier layer and a dielectric layer, respectively.
Figure 3C:
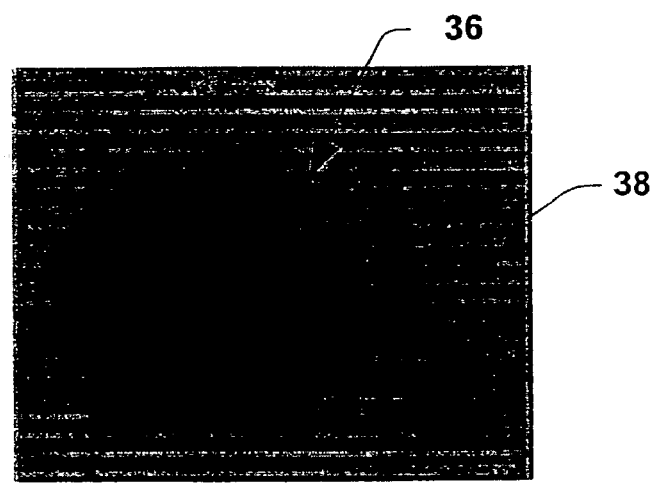
Figure 4A:
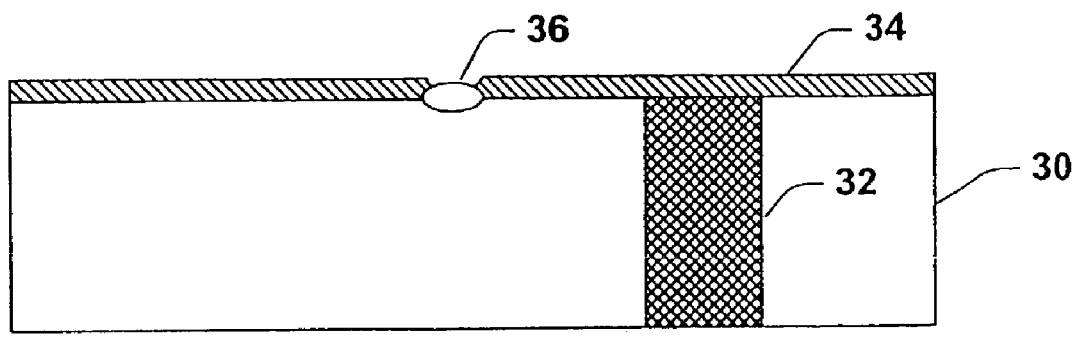
FIG. 4A is a cross section diagram illustrating an etch back of the barrier layer of FIG. 3A, revealing the defect associated with the underlying dielectric layer.
Figure 4B:
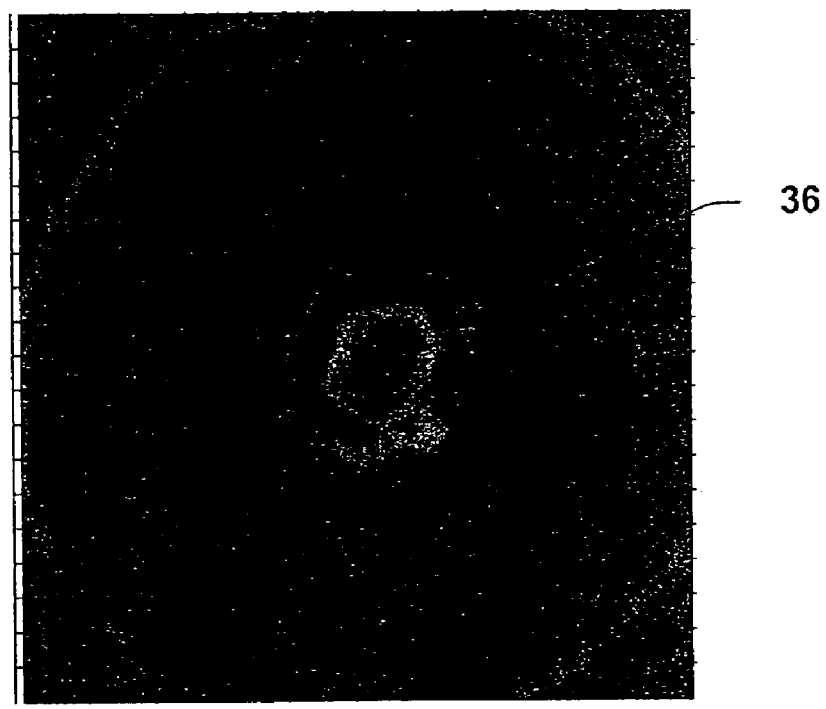
FIG. 4B is a plan view of an SEM photograph illustrating the exposed defect of FIG. 4A.
Figure 5A:
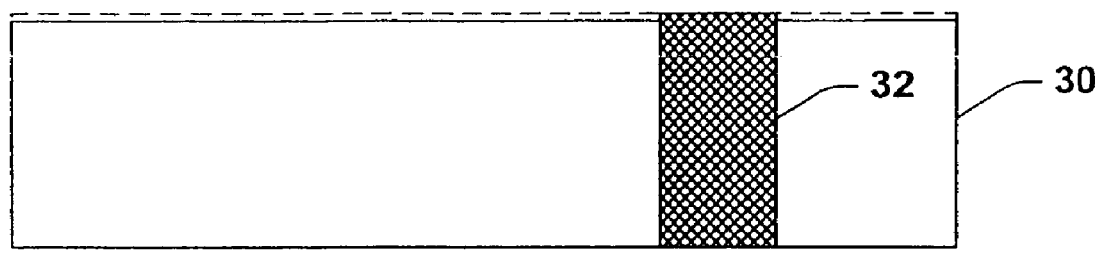
FIG. 5A is a cross section diagram illustrating the dielectric layer of FIG. 4A after substantially complete removal of the barrier layer of FIG. 4A, wherein removal of the barrier layer results in removal of the contaminant previously associated with the dielectric layer.
Figure 5B:
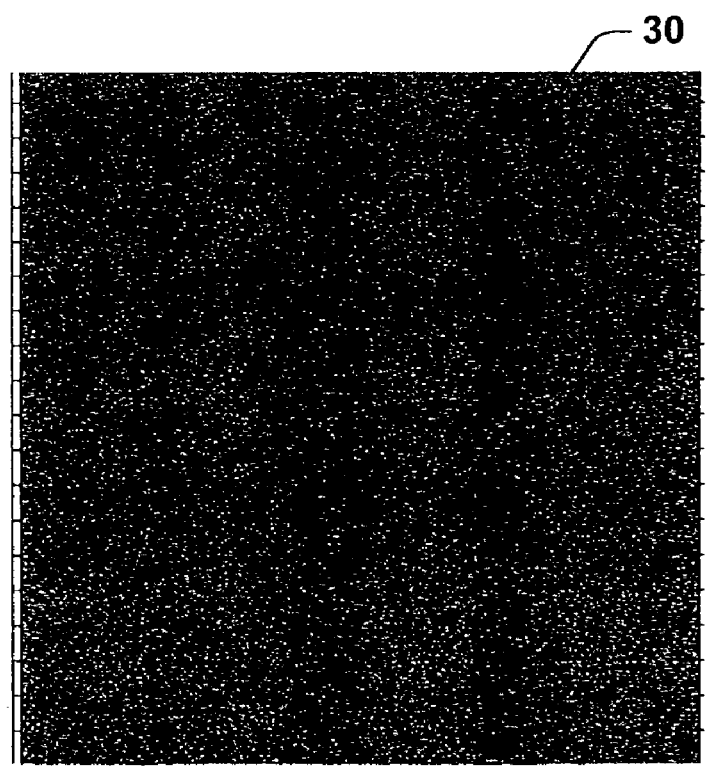
FIG. 5B is a plan view of an SEM photograph illustrating the dielectric layer of FIG. 5A after removal of the barrier layer and the contaminant.
Figure 6A:
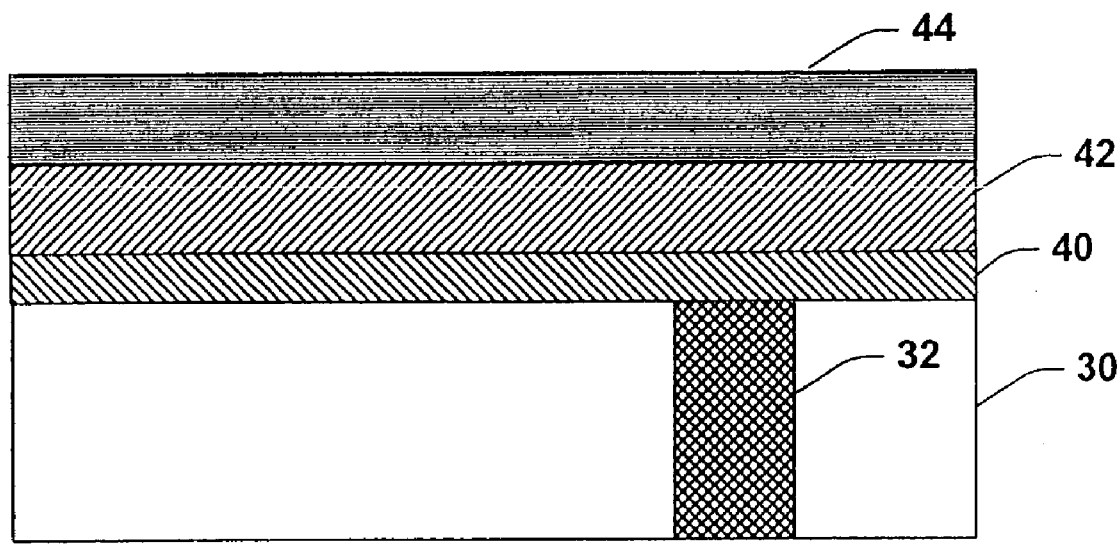
FIG. 6A is a cross section diagram illustrating a second dielectric layer overlying a barrier layer and the initial dielectric layer after removal of the sacrificial barrier layer.
Figure 6B:
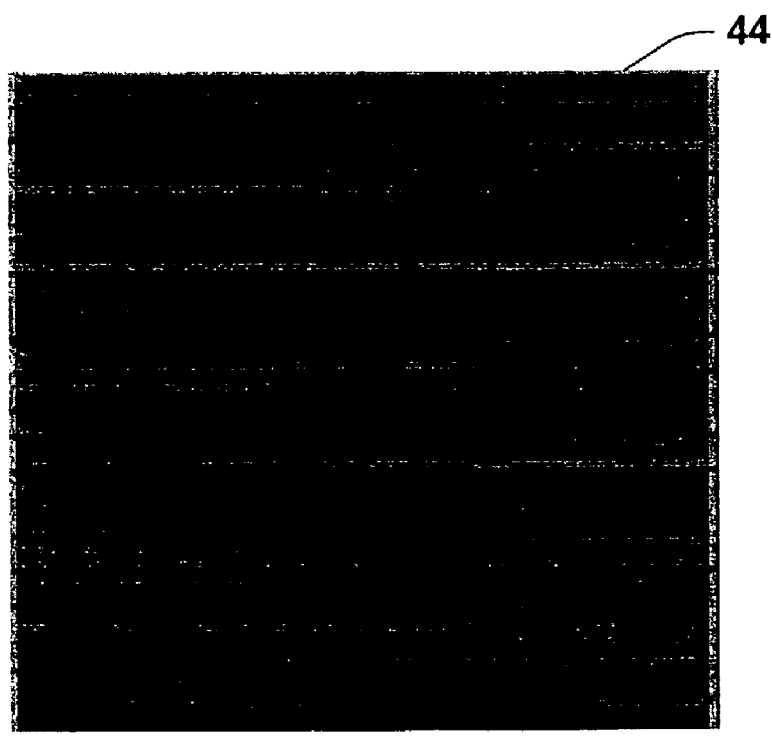
FIG. 6B is a plan view of an SEM photograph illustrating a portion of a second dielectric layer of FIG. 6A in accordance with the present invention, wherein contaminants associated with underlying low-k dielectric material has been eliminated.

To test the above hypothesis, the inventors of the present invention prepared a test wafer. Upon depositing the low-k dielectric film 30 over the substrate (e.g., as the second inter-metal dielectric overlying active circuitry), a defect 36 was found therein or otherwise associated therewith, as illustrated in FIG. 3A. A sacrificial film, in this example a SiC film 34 was formed over the low-k layer 30, and the defect 36 was again observed, as illustrated in FIG. 3B. FIG. 3C illustrates an affect of an untreated defect on the photoresist (e.g., lines and spaces are not formed in the photoresist in the vicinity of an underlying defect). A partial etch back process was then performed on the barrier layer 34 to expose a portion of the defect, as illustrated in FIGS. 4A and 4B, and finally the entire sacrificial layer 34 36 was removed by the remaining portion of the etch back process, and the defect was eliminated, as illustrated in FIGS. 5A and 5B. After removal of the defect, a new barrier layer 40 is formed thereover, followed by another low-k dielectric film 42 and a patterned photoresist 44, as illustrated in FIG. 6A. Upon evaluating the photoresist, the defect location is eliminated, and a potential pattern defect in the photoresist due to the contaminant is eliminated, as illustrated in FIG. 6B.

Figure 7:
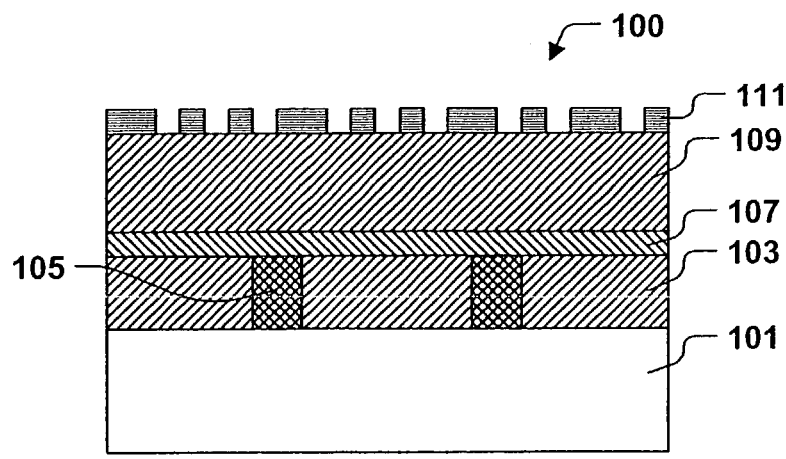
FIG. 7 is fragmentary a cross section diagram illustrating a patterned photoresist layer free of pattern defects in accordance with the present invention.

In light of the inventors' appreciation of the problem and above tests in light of the inventors' hypothesis, FIG. 7 illustrates an exemplary device 100 formed according to one aspect of the present invention. Device 100 includes substrate 101, underlying dielectric layer 103, copper features 105, barrier layer 107, overlying dielectric layer 109, and patterned resist 111. Contaminants have been removed from the underlying dielectric layer 103 by a process according to the present invention. Without such a process, contaminants could have diffused from the underlying dielectric layer 103, through the barrier layer 107, and through the overlying dielectric layer 109, into the resist layer 111 wherein the contaminants could have affected the formation of the resist pattern.

Figure 8:
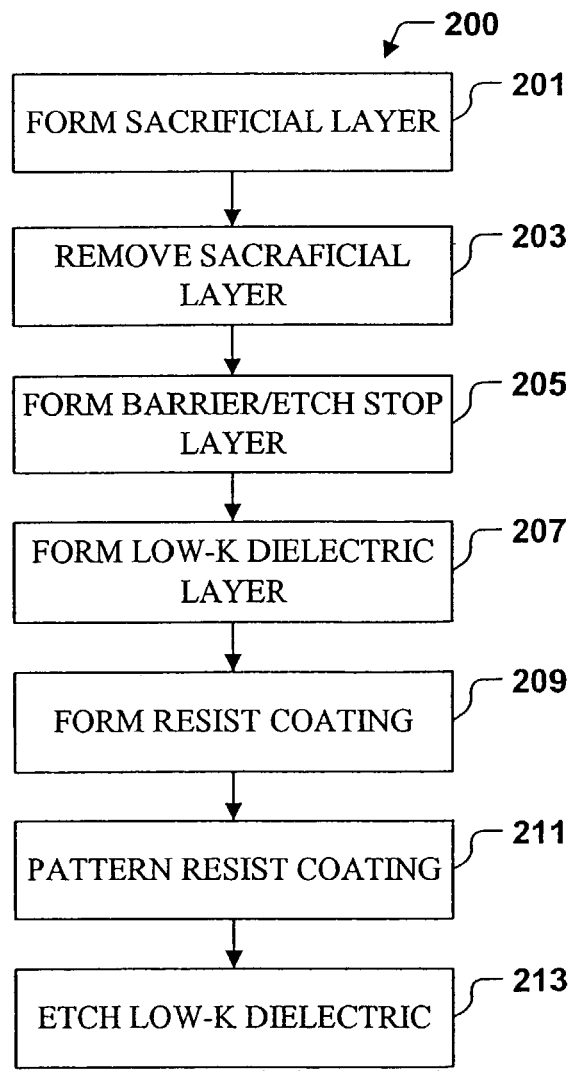
FIG. 8 is a flow chart of a process according to another aspect of the present invention.

FIG. 8 is a flow chart of a process 200 for providing a patterned low-k dielectric film or other layer over an underlying low-k dielectric film according to one aspect of the present invention. Acts 201 and 203 are forming a layer of sacrificial material over the underlying low-k dielectric film and then removing that sacrificial material. These acts remove contaminants from the underlying low-k dielectric film. The process 200 continues with forming a barrier/etch stop layer, act 205, forming the overlying low-k dielectric film, act 207, forming a resist coating, act 209, patterning the resist coating, act 211, and etching the overlying low-k dielectric film using the patterned resist coating as a mask, act 213.

The underlying low-k dielectric film is generally provided over a semiconductor substrate. A semiconductor includes a semiconductor, which is typically silicon. Other examples of semiconductors include GaAs and InP. In addition to a semiconductor, the substrate may include various elements therein and/or layers thereon. These can include metal layers, barrier layers, dielectric layers, device structures, active elements and passive elements including silicon gates, word lines, source regions, drain regions, bit lines, bases emitters, collectors, conductive lines, conductive vias, etc.

A low-k dielectric is a dielectric material having a dielectric constant significantly lower than that of silicon dioxide. Examples of low-k dielectrics include porous glasses and polyimide nanofoams. Porous glasses include organosilicate glasses (OSGs). The low-k dielectric can be organic or inorganic. Examples or organic low-k dielectric include benzocyclobutene, parylene, polyarylene ethers, and fluorocarbons. Examples of inorganic low-k dielectrics include porous silica, fluorinated amorphous carbon, methyl silsesquioxane, hydrogen silsesquioxane, and fluorinated silicon dioxide. Specific examples of low-k dielectric materials include Applied Material's Black Diamond®, Novellus' Coral®, Allied Signal's Nanoglass® and FLARE®, JSR's LKD5104®, Texas Instrument's Xerogel®, and Dow Chemical's BCB® and SiLK®. The low-k dielectric can be applied by any suitable means, including for example, spin coating or CVD.

The invention is suitable for removing a variety of contaminants. In one embodiment, the contaminant is a base. In a more specific embodiment, the contaminant is an amine, such as ammonia.

Act 201 is forming a sacrificial layer over the underlying low-k dielectric layer. The sacrificial layer is of a suitable type whereby the contaminant diffuses from the underlying low-k dielectric layer into the sacrificial layer. Preferably, the sacrificial layer reacts with the contaminant. Preferably, the sacrificial layer can be etched with selectivity against the low-k dielectric. In one embodiment, the sacrificial layer includes a barrier material. Examples of barrier materials include silicon carbide, silicon nitride, tantalum, tantalum nitride, titanium nitride, tungsten nitride, silicon oxynitride, and PSG (a phophosilicate glass). A barrier material for a sacrificial layer does not have to be the same as the barrier material used to form barriers in the finished device. However, one advantage of using the barrier material of the finished device to form the sacrificial layer is that contaminants that diffuse into the sacrificial material will include all the contaminants that could diffuse through the subsequently formed barrier layer and thereby potentially affect an overlying photoresist.

The sacrificial layer can be of any suitable thickness. In one embodiment, the sacrificial layer is from about 0.01 μm to about 100 μm thick. In another embodiment, the sacrificial layer is from about 0.2 μm to about 10 μm thick. In a further embodiment, the sacrificial layer is from about 0.3 μm to about 1 μm thick.

The sacrificial layer may be formed by any suitable process, including spin coating or CVD, for example. Mild heating may facilitate contaminant removal. Such heating may take place during the process of forming the sacrificial layer. Optionally, however, heat can be provided to facilitate diffusion into and/or reaction of contaminants with the sacrificial film. In one embodiment, the substrate, along with the sacrificial film, is heated to at least about 100° C. In another embodiment, it is heated to at least about 150° C. In a further embodiment, it is heated to at least about 200° C. The temperature is maintained for a short time. In one embodiment, it is maintained for at least about 10 minutes. In another embodiment, it is maintained for at least about 20 minutes. In a further embodiment, it is maintained for at least about 30 minutes.

The sacrificial layer formed with act 201 is removed by act 203. Acts 201 and 203 together provide a process for cleaning the underlying low-k dielectric. Generally, the sacrificial layer is removed by etching. Etching can be wet or dry, but dry etching is preferred. For example, where the sacrificial layer is SiC, it can be dry etched using a combination of $O_2$, $CF_4$, $CH_3F$, $N_2$ and Ar. A small portion of the underlying low-k dielectric, typically less that about 1000 Å, is sometimes removed together with the sacrificial layer.

The contaminants removed from the underlying low-k dielectric may result from chemical mechanical polishing. In addition to reactive contaminants, chemical mechanical polishing may leave behind small ceramic particle. Preferable, the process of removing sacrificial layer is also effective in removing any small ceramic particles left over from chemical mechanical polishing. This can be accomplished with a dry etch chemistry including, for example, a fluorine compound and/or Argon.

After removing the sacrificial layer, an overlying low-k dielectric layer, or a layer of another material, can be formed and patterned. Before forming the overlying low-k dielectric layer, a barrier/etch stop layer is deposited with act 205. Generally, this barrier/etch stop layer has a relatively low-k value. The overlying low-k dielectric layer is formed with act 207.

Act 209 is forming the resist coating over the low-k dielectric layer. Any suitable resist can be used. However, the invention is particularly useful when the resist is chemically amplified. Preferably, the resist contains a photo-acid, such as a compound that forms an acid on exposure to deep-UV radiation. The resist coating is applied by any suitable means, including, for example, spin coating.

Optionally, another barrier layer is provided between the resist and the overlying low-k dielectric. Such a barrier layer can provide additional protection against contamination of the resist.

Act 211 is selectively exposing the resist to actinic radiation and developing the resist. Exposure takes place through an intervening mask or reticle. Developing the resist generally includes a post-exposure bake followed by removal of the more soluble portions of the resist using a suitable solvent developer.

Act 213 is etching the overlying low-k dielectric, whereby the mask pattern is transferred into the overlying low-k dielectric. For example, where the low-k dielectric is OSG, it can be dry etch using Ar, $N_2$, and $C_4F_8$. The resist is subsequently stripped, another barrier layer is provided, and the gaps in the overlying dielectric layer are filled with copper.

Between acts 201 and 203, providing and removing the sacrificial layer, additional procedures can be carried out to facilitate the removal of contaminants from the underlying low-k film. In one embodiment, a second sacrificial layer can be provided and then removed. The second sacrificial layer can be, for example, a low-k dielectric layer, which will generally be effective in absorbing the types of contaminants found in the underlying low-k dielectric.

In another embodiment, a solvent for the contaminant is applied over the sacrificial layer. For example, a weak acid solution can be used as a solvent for amine contaminants. The sacrificial layer may prevent the solvent from contacting the underlying low-k dielectric layer. In addition, it should be understood that the present invention is applicable to standard semiconductor processing as well as re-work type processing, and both applications, as well as others, are contemplated as falling within the scope of the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description and the claims, such terms are intended to be inclusive in a manner similar to the term "comprising."

What is claimed is:

1. A method of fabricating an integrated circuit, comprising the following steps performed in order:
    forming a sacrificial layer on a surface of a semiconductor body, wherein the sacrificial layer reacts with a contaminant at said surface and wherein said contaminant comprises ammonia;
    removing said sacrificial layer from an entirety of said surface;
    forming a low-k dielectric layer over the surface;
    forming a photoresist mask over the low-k dielectric layer; and
    etching the low-k dielectric layer using the photoresist mask.

2. The method of claim 1, further comprising the step of forming a barrier layer on said surface prior to forming the low-k dielectric layer, wherein said low-k dielectric layer is formed directly on said barrier layer.

3. The method of claim 1, wherein the step of forming a photoresist mask comprises the steps of:
    coating the low-k dielectric layer with a chemically amplified photoresist;
    selectively exposing the photoresist to actinic radiation; and
    developing the photoresist.

4. The method of claim 1, wherein the photoresist comprises a photo-acid.

5. The method of claim 1, further comprising forming a barrier layer over the low-k dielectric layer prior to coating with the resist.

6. The method of claim 1, wherein the step of removing the sacrificial layer comprises dry etching with a chemistry that removes small ceramic particles.

7. The method of claim 1, wherein the sacrificial layer comprises SiC.

* * * * *